United States Patent
Hsu et al.

(10) Patent No.: US 6,507,066 B1
(45) Date of Patent: Jan. 14, 2003

(54) HIGHLY RELIABLE FLASH MEMORY STRUCTURE WITH HALO SOURCE

(75) Inventors: Ching-Hsiang Hsu, Hsin-Chu (TW); Mong-Song Liang, Hsin-Chu (TW); Steve S. Chung, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/567,416

(22) Filed: May 9, 2000

Related U.S. Application Data

(62) Division of application No. 09/102,122, filed on Jun. 19, 1998, now Pat. No. 6,087,219.

(51) Int. Cl.$^7$ .................. H01L 29/76; H01L 29/788
(52) U.S. Cl. .................. 257/314; 257/315; 257/316; 438/201; 438/211; 438/257
(58) Field of Search .................. 257/314–323; 438/257, 201, 211, 527, 546

(56) References Cited

U.S. PATENT DOCUMENTS

| | | | | |
|---|---|---|---|---|
| 5,350,938 A | * | 9/1994 | Matsukawa et al. | 257/378 |
| 5,464,785 A | * | 11/1995 | Hong | 437/43 |
| 6,025,625 A | * | 2/2000 | Chi | 257/315 |
| 6,054,732 A | * | 4/2000 | Ho et al. | 257/314 |
| 6,103,602 A | * | 8/2000 | Thurgate et al. | 438/525 |
| 6,111,286 A | * | 8/2000 | Chi et al. | 257/315 |

FOREIGN PATENT DOCUMENTS

EP 0 558 404 A2 * 1/1993

* cited by examiner

*Primary Examiner*—Steven Loke
*Assistant Examiner*—Donghee Kang
(74) *Attorney, Agent, or Firm*—George O. Saile; Stephen B. Ackerman; Graham S. Jones

(57) ABSTRACT

A method of forming a Flash EEPROM device with a gate electrode stack includes forming a tunnel oxide layer, a floating gate electrode layer, a dielectric layer, and a control gate layer on a doped silicon semiconductor substrate. Then form source/drain regions in the substrate. Next, form a surface P+ doped halo region in the surface of the N+ source region juxtaposed with the control gate electrode. The P+ halo region is surrounded by the N+ source region. The result is a device which is erased by placing a negative voltage of about −10V on the control gate and a positive voltage of about 5V on the combined source region/halo region to produce accumulation of holes in the channel which distributes the flow of electrons into the channel rather than concentrating the electrons near the interface between the source region and the edge of the tunnel oxide layer. The tunnel oxide layer has a thickness from about 70 Å to about 120 Å.

27 Claims, 3 Drawing Sheets

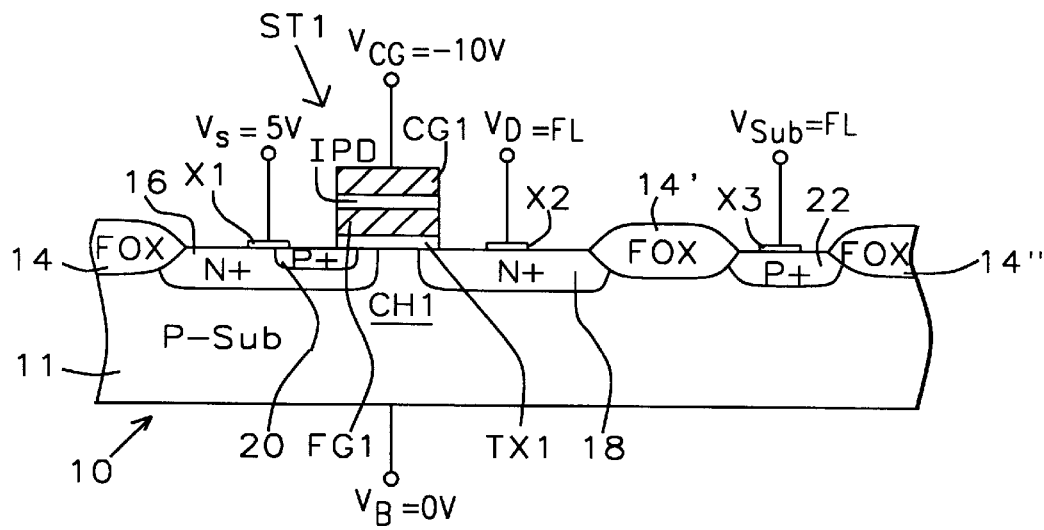
*FIG. 1*
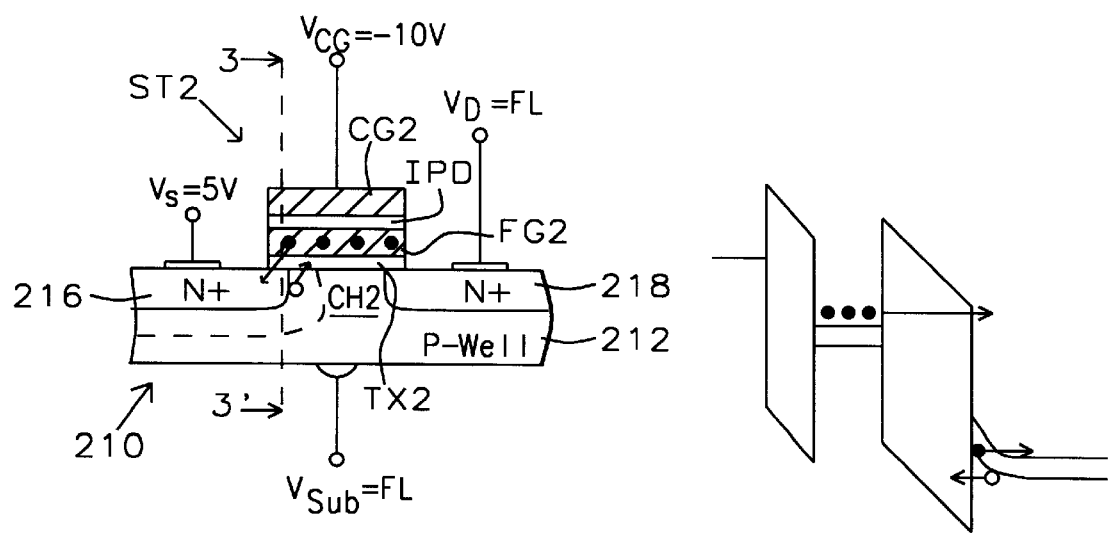
*FIG. 2*       *FIG. 3*

HIGHLY RELIABLE FLASH MEMORY STRUCTURE WITH HALO SOURCE

This is a division of patent application Ser. No. 09/102,122, filing date Jun. 19, 1998 now U.S. Pat. No. 6,087,219, Highly Reliable Flash Memory Structure With Halo Source, assigned to the same assignee as the present invention.

BACKGROUND OF THE INVENTION

1. Field of the Invention

This invention relates to semiconductor devices and particularly to erasable programmable flash memory devices.

2. Description of Related Art

Holes induced by source erase cause a reliability problem in Flash memory devices. Although use of negative gate source erase alleviates hot hole injection, the problem is that it does not eliminate hot hole generation.

U.S. Pat. No. 5,395,773 of Ravindhran et al. shows a MOSFET with a gate penetrating halo implant. However, the halo implant is below the source/drain (S/D) regions and is for a different purpose from the halo ion implant of the invention.

SUMMARY OF THE INVENTION

An advantage of this invention is that a surface halo source structure is used in which an N-type region surrounds a P-type region forming a combined P-type/N-type source region. The result is provision of a channel erase function performed at the same bias voltage as the source erase, which eliminates hole injection and hole generation. Thus channel erase can be achieved with a bias condition similar to source erase. Hot hole injection can be eliminated due to the employment of channel erase.

In accordance with this invention, a Flash EEPROM memory device includes a gate electrode stack formed on the surface of a doped silicon semiconductor substrate and, a source region and a drain region formed in the surface of the doped silicon semiconductor substrate. The device includes a surface halo formed in the surface of the source region juxtaposed with the gate electrode stack without any halo region in the surface of the drain region. Thus, an asymmetric device is provided with the halo region separated from the semiconductor substrate by intervening portions of the source region. Preferably, the source region and the drain region are located in the surface of the substrate, with the source region and the drain region being located aside from the gate electrode stack in overlapping relationship with the gate electrode stack. In addition, a surface halo region is formed in the surface of the source region surrounded by the source region and juxtaposed with the gate electrode stack and with a slight overlap in position of the halo region with the gate electrode stack.

Preferably, a contact region is doped with P type boron dopant with a dose from about 5 E 14 ions/cm$^2$ to about 5 E 15 ions/cm$^2$. The contact region is formed in the doped silicon semiconductor material.

The P type BF$_2$ dopant was ion implanted into a P+ type halo region with a dose from about 5 E 14 ions/cm$^2$ to about 5 E 15 ions/cm$^2$, at an energy from about 10 keV to about 30 keV. The tunnel oxide layer has a thickness from about 70 Å to about 120 Å.

The device is erased with a negative voltage from about −10 Volts to about −15 Volts on the control gate electrode and a positive voltage from about 10 Volts to about 5 Volts on the source region.

The device is erased with voltages applied during the erase mode as follows:

$V_{CG}$ = −10 V
$V_S$ = 5 V
$V_D$ = FL
$V_{Sub}$ = FL $V_{CG}$ = Control Gate Voltage
$V_S$ = Source Voltage
$V_D$ = Drain Voltage
$V_{Sub}$ = P-Well Voltage

BRIEF DESCRIPTION OF THE DRAWINGS

The foregoing and other aspects and advantages of this invention are explained and described below with reference to the accompanying drawings, in which:

FIG. 1 shows a Flash EEPROM (Electrically Erasable PROgrammable Memory) device in accordance with this invention.

FIG. 2 shows a Flash EEPROM device which includes a P-well.

FIG. 3 shows an energy band diagram of the device of FIG. 2 taken along a cross section along line 3–3'.

DESCRIPTION OF THE PREFERRED EMBODIMENT

Figure 4:
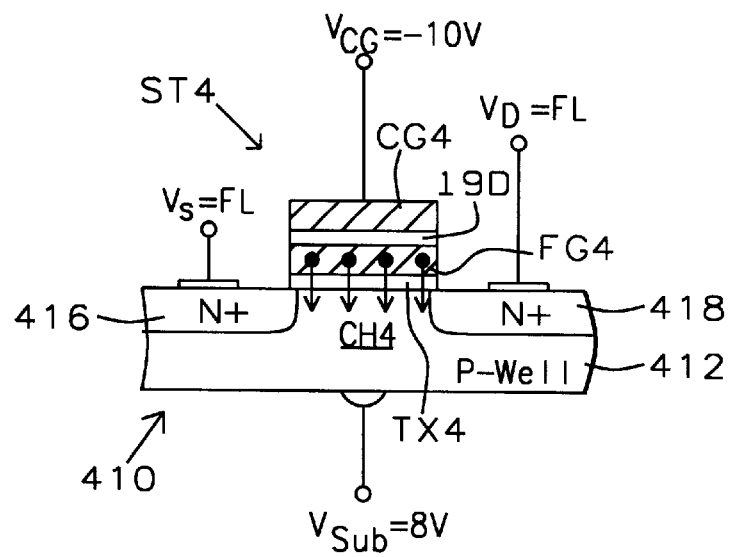
FIG. 4 shows a Flash EEPROM device including a P-well with a gate electrode stack centered on the surface of the P-well.

In FIG. 1, a Flash EEPROM device 10 in accordance with this invention is formed on a P− doped silicon semiconductor substrate 11 with a surface halo region 20 in source region 16. The halo structure provides the combination of the P-type halo region 20 surrounded by the N-type region 16 in a synergistic combination. The result is a device which provides a channel erase, at the same bias voltage as the source erase. This feature eliminates hole injection and hole generation.

FIG. 1 shows a Flash EEPROM (Electrically Erasable PROgrammable Memory) device 10, in accordance with this invention, formed on a P-doped silicon semiconductor substrate 11 (doped with P type dopant) formed with three FOX regions 14, 14' and 14" on the surface of the P-sub-strate 11. Between the first and third FOX regions 14 and 14", on the surface of substrate 11 is located a second FOX region 14'. Centered between the first and second FOX regions 14 and 14' on the surface of the substrate 11 is located a gate electrode stack ST1.

Stack ST1 includes a tunnel oxide layer TX1 having a thickness from about 70 Å to about 120 Å formed on the surface of the P-substrate 11 above a channel region CH1 formed in P-substrate 11. Above tunnel oxide layer TX1 is formed a doped polysilicon, floating gate electrode FG1 having a thickness from about 1,000 Å to about 2,000 Å. Next is an Inter-Polysilicon Dielectric layer IPD, preferably composed of ONO (silicon Oxide/silicon Nitride/silicon Oxide). The ONO layer IPD is more broadly an Inter-Polysilicon Dielectric (IPD). On top is a control gate electrode CG1, composed of doped polysilicon having a thickness from about 1,000 Å to about 2,000 Å.

Shown on the left of the gate electrode stack ST1, is an N+ doped source region 16 self-aligned with stack ST1. Source region 16 is located between the gate electrode stack ST1 and the first FOX region 14. An N+ doped drain region 18 self-aligned with stack ST1 is located between gate electrode stack ST1 and the second FOX region 14'. The N+ doped source/drain regions 16/18 are doped with a dose of arsenic dopant ion implanted with a dose from about 5 E 14 atoms/cm$^2$ to about 5 E 15 atoms/cm$^2$ at an energy from about 25 keV to about 40 keV.

The N+ doped source region 16 and the N+ doped drain region 18 respectively overlap the opposing edges of the gate electrode stack ST1 with the channel CH1 of the Flash EEPROM device 10 located between N+ doped source region 16 and the N+ doped drain region 18.

Halo P+ doped region 20 is formed within the N+ doped source region 16 in the surface of the substrate 11 juxtaposed with the gate electrode stack ST1, but with a slight overlap between the halo P+ region 20 with the left edge of the gate electrode stack ST1.

On the right side of device 10 adjacent to drain region 18, a P+ doped contact region 22 is located in substrate 11 between the second FOX region 14' and third FOX 14'' on the surface of substrate 11.

Above the interface between source region 16 and P+ doped surface halo region 20 is located a contact X1 connected to voltage source $V_s$ which is set at five Volts (5V).

The cell structure is similar to a stack gate electrode structure except that there is the halo region 20 in the N+ source region in combination with the surface P+ halo region 20. A particular feature of the device of FIG. 1 is that the surface P+ region 20 is located inside and surrounded by the N+ source region 16.

During the erase condition, the control gate electrode CG1 is negatively biased at a voltage of about −10 Volts while the source region 16 is positively biased at a voltage of about 5 Volts. As a result, the channel CH1 will be in the accumulation mode (having an enhanced concentration of holes) and the N-type source region 16 will be inverted such that a hole channel is formed under the erase bias condition thereby causing the potential of the channel CH1 to be equal to the voltage applied to the source or about 5 Volts. A high electrical field is therefore established between the floating gate electrode and channel CH1 (filled with holes uniformly) such that a channel erase is achieved. The channel erase eliminates the hole generation and injection which occurs in the source erase (whether or not a negative control gate electrode voltage is applied) and to improve the reliability of the Flash Memory device.

In FIG. 1, a contact X2 is formed above the drain region 18. Contact X2 connects drain region 18 to voltage $V_D$ which floats at voltage FL (FLoating Voltage).

The voltage $V_{sub}$ is connected to the P− doped substrate 11. A contact X3 is formed above the P+ doped contact region 22. The P-substrate 11 is connected, via contact region 22, to voltage $V_{sub}$, which floats at voltage FL.

The device 11 is erased with a negative voltage from about −10 Volts to about −15 Volts on the control gate electrode CG1 and a positive voltage from about 10 Volts to about 5 Volts on the source region 16 and the halo region 20.

The range of voltages which can be applied during the erase mode are as follows:

TABLE I

| |
|---|
| $V_{CG}$ = −10 V to −15 V |
| $V_S$ = 10 V to 5 V |
| $V_D$ = FL |
| $V_{Sub}$ = FL |
| $V_{CG}$ = Control Gate Voltage |
| $V_S$ = Source Voltage |
| $V_D$ = Drain Voltage |
| $V_{Sub}$ = P-Sub Voltage |

Preferably the voltages applied during the erase mode are as follows:

TABLE II

| |
|---|
| $V_{CG}$ = −10 V |
| $V_S$ = 5 V |
| $V_D$ = FL |
| $V_{Sub}$ = FL |
| $V_{CG}$ = Control Gate Voltage |
| $V_S$ = Source Voltage |
| $V_D$ = Drain Voltage |
| $V_{Sub}$ = P-Well Voltage |

FIG. 2 shows a Flash EEPROM device 210 which includes a P-well 212 in which there is a problem with a source erase with the source region 216 in the P-well 212. It is the problem of oxide degradation of tunnel oxide layer TX2 due to the energy from hot hole injection during application of a source erase voltage of −10 Volts at the control gate electrode CG1 to the source region 216 at a voltage of 5 Volts.

Referring to FIG. 2, Flash EEPROM device 210 includes a P-well 212. A gate electrode stack ST2 is located in the center of the surface of the P-well 212. Stack ST2 includes a tunnel oxide layer TX2 formed on the surface of the P-well above the channel CH2. Above tunnel oxide layer TX2 is formed a floating gate electrode FG2, an ONO layer IPD and a control gate electrode CG2. Shown on the left of the gate electrode stack ST2, is a self-aligned N+ doped source region 216. A self-aligned N+ doped drain region 218 is located to the right of gate electrode stack ST2.

The N+ doped source region 216 and the N+ doped drain region 218 respectively overlap the opposing edges of the gate electrode stack ST2 with the channel CH2 of the Flash EEPROM device 210 located between N+ doped source region 216 and the N+ doped drain region 218. The electrons from the floating gate electrode FG2 pass down through the tunnel oxide layer TX2 directly to the source region 216 through a very narrow space as indicated by the arrow through tunnel oxide layer TX2 from the floating gate electrode FG2 to the source region 216.

The voltages applied during the erase mode are as follows:

TABLE III

| |
|---|
| $V_{CG}$ = −10 V |
| $V_S$ = 5 V |
| $V_D$ = FL |
| $V_{CG}$ = Control Gate Voltage |
| $V_S$ = Source Voltage |
| $V_D$ = Drain Voltage |

FIG. 3 shows an energy band diagram of the device of FIG. 2 taken along a cross section along line 3–3'.

Alternative Solutions for Alleviation of Hot Hole Injection Negative Gate Erase (Source Erase):

Using the approach of FIG. 2, one solution is to use a smaller source voltage than suggested in connection with FIG. 2. The disadvantage with a lower source voltage is that although the negative gate electrode erase voltage can reduce hole injection, a positive source voltage greater than about 4 Volts will induce hole injection.

Channel Erase (NAND operation)

Another way to alleviate hot hole injection is to extract electrons from the floating gate electrode to channel region uniformly so that band-to-band hole injection will not occur as illustrated in the Flash EEPROM device 410 shown in FIG. 4. Flash EEPROM device 410 includes an P-well 412 with a gate electrode stack ST4 centered on the surface of the P-well 412.

Stack ST4 includes a tunnel oxide layer TX4 formed on the surface of the P-well above the channel CH4. Above tunnel oxide layer TX4 is formed a floating gate electrode FG4, an ONO layer IPD and a control gate electrode CG4. Shown on the left of the gate electrode stack ST4, is an N+ doped source region 416. A N+ doped drain region 418 is located to the right of gate electrode stack ST4. Source/drain regions 416/418 are self-aligned with the gate electrode stack ST4.

The N+ doped source region 416 and the N+ doped drain region 418 respectively overlap the opposing edges of gate electrode stack ST4. The channel CH4 of the Flash EEPROM device 410 is located in the P-well 412 between N+ doped source region 416 and the N+ doped drain region 418. The electrons in the floating gate electrode pass through the tunnel oxide layer TX4 to the P-well 412 to the substrate through a wide space all along the tunnel oxide layer TX4, as indicated by the arrows through tunnel oxide layer TX4 from the floating gate electrode FG4 towards the lower surface of P-well 412.

Figure 5:
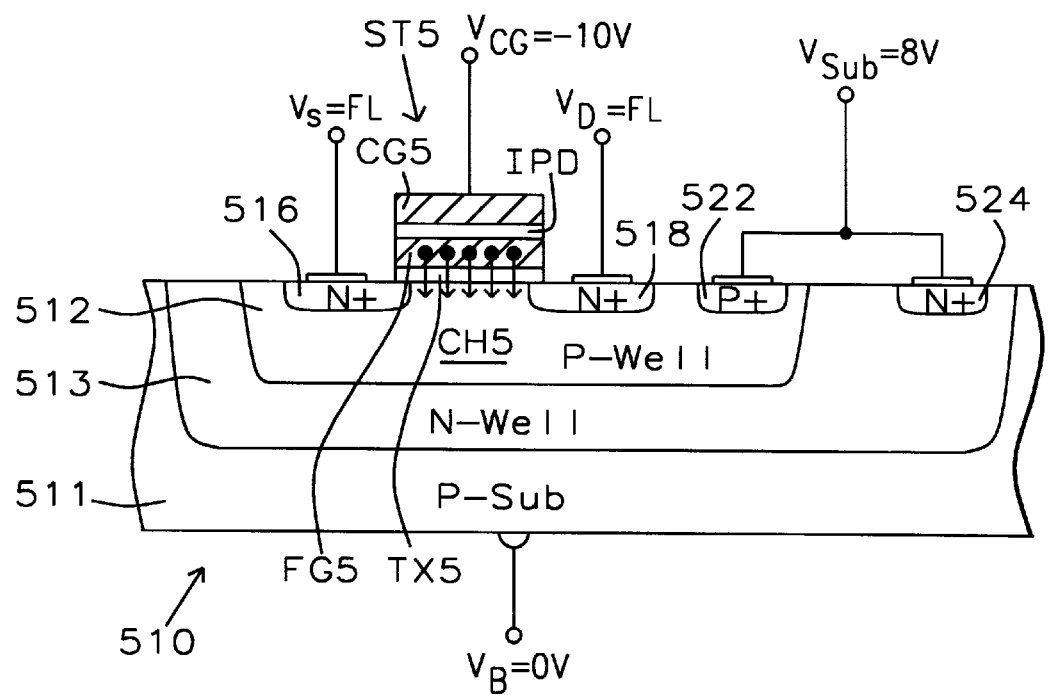
FIG. 5 shows a Flash EEPROM device which includes a P-well located within an N-well.

The voltages applied during the erase mode are as follows:

TABLE IV $V_{CG}$ = -10 V
$V_S$ = FL V
$V_D$ = FL V
$V_{Sub}$ = 8 V $V_{CG}$ = Control Gate Voltage
$V_S$ = Source Voltage
$V_D$ = Drain Voltage
$V_{Sub}$ = Substrate Voltage The problem with the channel erase approach shown in FIG. 4 is that it is too costly and complex because a triple well technology is needed in order not to affect the operation of the peripheral circuit due to the application of bias in P-Sub as shown in FIG. 5.

In particular in FIG. 5, a Flash EEPROM device 510 includes a P-well 512. Centered on the surface of the P-well 512 is located a gate electrode stack ST5.

Stack ST5 includes a tunnel oxide layer TX5 having a thickness from about 70 Å to about 120 Å formed on the surface of the P-well above the channel CH5. Above tunnel oxide layer TX5 is formed a floating gate electrode FG5, composed of doped polysilicon having a thickness from about 1,000 Å to about 2,000 Å, an ONO layer IPD, and a control gate electrode CG5, composed of doped polysilicon having a thickness from about 1,000 Å to about 2,000 Å.

Shown on the left of the gate electrode stack ST5, is a self-aligned N+ doped source region 516. A self-aligned N+ doped drain region 518 is located to the right of gate electrode stack ST5. The N+ source/drain regions 516/518 are doped with a dose of arsenic dopant from about 5 E14 atoms/cm$^2$ to about 5 E 15 atoms/cm$^2$.

The N+ doped source region 516 and the N+ doped drain region 518 respectively overlap the opposing edges of the gate electrode stack ST5 with the channel CH5 of the Flash EEPROM device 510 located between N+ doped source region 516 and the N+ doped drain region 518 in P-Well 512. The electrons in the floating gate electrode FG5 pass through the tunnel oxide layer TX5 to the P-well 512 in an N-well 513 in the P- doped substrate 511 through a wide space all along the tunnel oxide layer TX5, as indicated by the arrows through tunnel oxide layer TX5 from the floating gate electrode FG5 towards the surface of P-well 512.

The P-well 512 includes a P+ doped region 522 to the right of the drain region 518 and the N-well 513 includes an N+ doped region 524 to the right of the P+ doped region 522. The voltage source $V_{sub}$ is connected to the P+ doped region 522 and the N+ doped region 524. The N-well 513 is formed in the P-Substrate 511 and the substrate 511 is connected to voltage $V_s$ which is a potential of 0 Volts .

Figure 6:
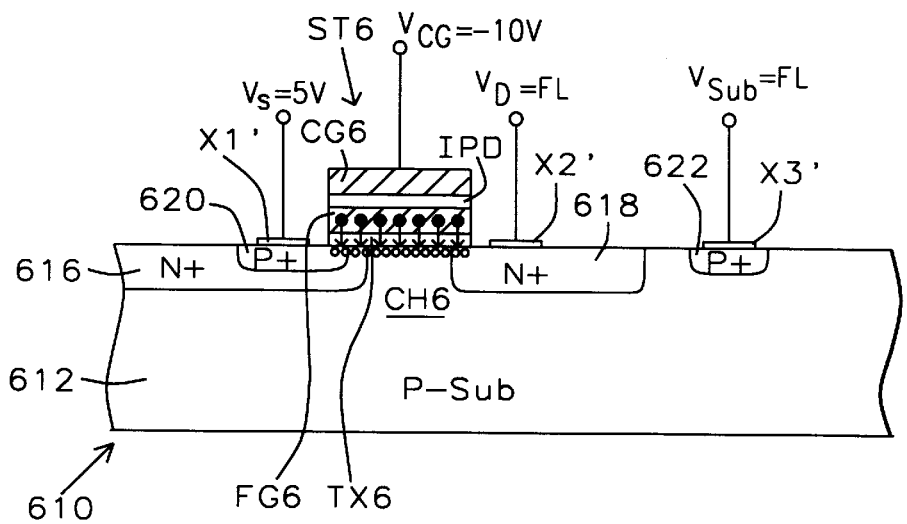
FIG. 6 shows a Flash EEPROM (Electrically Erasable PROgrammable Memory) device, similar to the device of FIG. 1, in accordance with this invention.

The voltages applied during the erase mode are as follows:

TABLE V $V_{CG}$ = -10 V
$V_S$ = FL
$V_D$ = FL
$V_{Sub}$ = 8 V
$V_B$ = 0 V $V_{CG}$ = Control Gate Voltage
$V_S$ = Source Voltage
$V_D$ = Drain Voltage
$V_{Sub}$ = Substrate Voltage
$V_B$ = Ground Voltage FIG. 6 shows a Flash EEPROM (Electrically Erasable PROgrammable Memory) device, similar to the device of FIG. 1, in accordance with this invention.

In FIG. 6, a Flash EEPROM device 610 is shown formed on a P- doped substrate 612. Centered on the surface of the P-substrate 612 is located a gate electrode stack ST6 above the channel CH6 which is formed in the center of the surface substrate 612. Gate electrode stack ST6 includes a tunnel oxide layer TX6 formed on the surface of the P-substrate above the channel CH6. Above tunnel oxide layer TX6 is formed a floating gate electrode FG6, an Inter-Polysilicon Dielectric, ONO layer IPD and a control gate electrode CG6. Shown on the left of the gate electrode stack ST6, is a self-aligned N+ doped source region 616. A self-aligned N+ doped drain region 618 is located to the right of gate electrode stack ST6.

In accordance with this invention, a P+ doped halo region 620 is formed within and surrounded by the N+ doped source region 616. P+ doped halo region 620 is formed in the surface of the P-substrate 612 juxtaposed with the gate electrode stack ST6, but with a slight overlap of the halo P+ region 620 with the left edge of the gate electrode stack ST6.

The N+ doped source region 616 and the N+ doped drain region 618 respectively overlap the opposing edges of the gate electrode stack ST6. The channel CH6 of the Flash EEPROM device 610 is located between N+ doped source region 616 and the N+ doped drain region 618 in P-substrate 612. The electrons in the floating gate electrode FG6 pass through the tunnel oxide layer TX6 into the P-substrate 612 through a wide space all along the tunnel oxide layer TX6, as indicated by the arrows through tunnel oxide layer TX6 from the floating gate electrode FG6 towards the surface of P-substrate 612 along the channel CH6 and the source and drain regions 616/620 as well as the right edge of the halo region 620.

The P-substrate 612 includes a P+ doped region 622 to the right of the drain region 618 and adjacent thereto, but unlike the device of FIG. 5, it does not include an N+ doped region (like region 524) to the right of the P+ doped region 622. The floating voltage FL of voltage $V_{sub}$ is connected via contact X3' to the P+ doped region 622 and via the contact X2' to the N+ doped region 624. The voltage $V_s$ is connected via contact X1' to the P+ doped source region 616 and halo region 620.

The range of voltages which can be applied during the erase mode are as follows:

TABLE VI

| |
|---|
| $V_{CG}$ = –10 V to –15 V |
| $V_S$ = 10 V to 5 V |
| $V_D$ = FL |
| $V_{Sub}$ = FL |
| $V_{CG}$ = Control Gate Voltage |
| $V_S$ = Source Voltage |
| $V_D$ = Drain Voltage |
| $V_{Sub}$ = P-Well Voltage |

Preferably the voltages applied during the erase mode are as follows:

TABLE VII

| |
|---|
| $V_{CG}$ = –10 V |
| $V_S$ = 5 V |
| $V_D$ = FL |
| $V_{Sub}$ = FL |
| $V_{CG}$ = Control Gate Voltage |
| $V_S$ = Source Voltage |
| $V_D$ = Drain Voltage |
| $V_{Sub}$ = Substrate Voltage |

The surface halo source Flash EEPROM memory in accordance with this invention shown in FIG. 6 has the following unique features.
1. A source biased channel erase feature is provided.
2. In addition, unlike the device of FIG. 5, no triple well is necessary.

Since the control gate electrode voltage is significantly negative ($V_{CG}$=–10V) the channel CH6 accumulates holes.

The source voltage $V_s$=5V is distributed to the channel CH6 through the accumulated holes formed therein.

Method of Manufacture of Flash EEPROM device with surface halo region.

PROCESS

Figure 7:
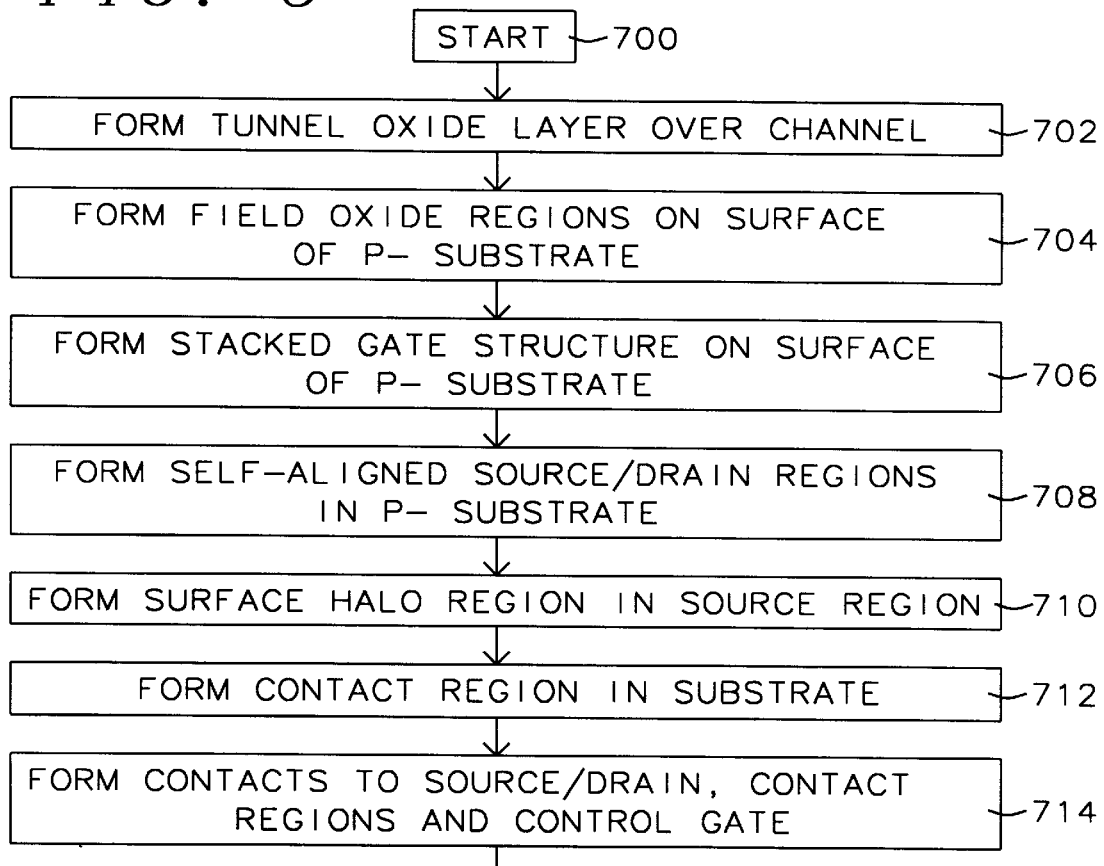
FIG. 7 shows the process flow, in accordance with this invention, for manufacture of the device of FIG. 1.

FIG. 7 shows the process flow for manufacture of the device 10 of FIG. 1. The process flow begins with a silicon semiconductor substrate 11 on which the device 10 of FIG. 1, in accordance with this invention is to be formed. The method starts with block 700.

Then a tunnel oxide layer TX1, having a thickness from about 70 Å to about 120 Å, is formed as shown by block 702 in FIG. 7.

Next, FOX regions 14, 14' and 14" are formed on the surface of device 10 as described in block 704 in FIG. 7.

Then, as described in block 706 in FIG. 7, gate electrode stack layers are deposited in blanket form including a doped polysilicon floating gate electrode layer FG1 having a thickness from about 1,000 Å to about 2,000 Å, an ONO layer IPD having a thickness from about 100 Å to about 200 Å, and a doped polysilicon control gate electrode layer CG1 having a thickness from about 1,000 Å to about 2,000 Å. Then, a cell defining photoresist mask is formed over the gate electrode stack blanket layers, TX1, FG1, ONO (IPD), and CG1. Then the portions of those layers unprotected by the mask are etched away by RIE (Reactive Ion Etching) and the cell defining mask is stripped away leaving behind the gate electrode stack 30.

Source/Drain Regions

In block 708, a source/drain mask is formed with an opening over the source/drain regions for the device 10 and then the source/drain regions 16/18 are formed in a self-aligned ion implantation step. Then N+ dopant is ion implanted into source/drain regions 16/18 comprising a dose of arsenic dopant from about 5 E 14 ions/cm² to about 5 E 15 ions/cm² at an energy from about 25 keV to about 40 keV. Then the source/drain mask is stripped from the device 10.

Halo Region

Next, referring to block 710 in FIG. 7, a P+ halo dopant mask is formed to implant the surface halo region 20 in the N+ source region 16 permitting a self-aligned implant on the source side of the gate electrode stack 30 extending partially into the source region 16. The halo region 20 is formed with P+ $BF_2$ dopant. The dose of $BF_2$ dopant is ion implanted through the mask into the halo region 16. The dose is in a range from about 5 E 14 ions/cm² to about 5 E 15 ions/cm² at an energy from about 10 keV to about 30 keV.

Then the halo mask is stripped from the device.

Contact Region

Next, in accordance with block 712 in FIG. 7, a P+ contact region mask is formed to implant the surface region 22 in the substrate 11 below contact X3. A self-aligned implant is performed through the mask and between the FOX region 14' and FOX region 14" into region 22 in the surface of substrate 11. The P+ boron contact region dopant is ion implanted into region 22 with a dose from about 5 E 14 ions/cm² to about 5 E 15 ions/cm² at an energy from about 10 keV to about 20 keV. On the right side of device 10, the P+ doped contact region 22 is located adjacent to drain region 18.

Then, the contact region mask is stripped from device 10.

Contacts

In block 714 contacts to the source 16, the drain region 18, contact region 22 and the N-sub are all provided.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A Flash EEPROM memory device including a doped substrate composed of silicon semiconductor material having a gate electrode stack formed on the top surface of the substrate, a source region and a drain region formed in the surface of the doped substrate comprising:

the gate electrode stack comprising a floating gate electrode, and a control gate formed over the top surface of the substrate, the source region and the drain region being located in the surface of the substrate, with the source region and the drain region being located aside from the gate electrode stack in overlapping relationship with the gate electrode stack, and a surface halo region formed only in the surface of the source region extending partially into the source region and surrounded by the source region and the halo region being juxtaposed with the gate electrode stack with a slight overlap in position of the halo region with the gate electrode stack, and the drain region being formed without a halo region, whereby the channel erase function can be performed with a similar bias condition to the source erase function.

2. The device of claim 1 wherein a contact region is formed in the doped substrate adjacent to the drain region.

3. The device of claim 1 wherein the P+ $BF_2$ dopant was ion implanted into the halo region with a dose from about 5 E 14 ions/cm$^2$ to about 5 E 15 ions/cm$^2$ at an energy from about 10 keV to about 30 keV.

4. The device of claim 3 wherein a contact region is formed in the doped substrate.

5. A device in accordance with claim 4 wherein the tunnel oxide layer has a thickness from about 70 Å to about 120 Å, and the contact region is doped with boron P type dopant with a dose from about 5 E 14 ions/cm$^2$ to about 5 E 15 ions/cm$^2$.

6. The device of claim 1 wherein the device is erased with a negative Voltage on the control gate electrode and a positive voltage on the source region.

7. The device of claim 1 wherein the device is erased with a negative voltage from about −10 Volts to about −15 Volts on the control gate electrode and a positive voltage from about 10 Volts to about 5 Volts on the source region.

8. The device of claim 1 wherein the device is erased with voltages applied during the erase mode as follows:

$V_{CG}$ = −10 V to −15 V
$V_S$ = 10 V to 5 V
$V_D$ = FL
$V_{Sub}$ = FL $V_{CG}$ = Control Gate Voltage
$V_S$ = Source Voltage
$V_D$ = Drain Voltage
$V_{Sub}$ = P-Well Voltage.

9. The device of claim 1 wherein the device is erased with voltages applied during the erase mode as follows:

$V_{CG}$ = −10 V
$V_S$ = 5 V
$V_D$ = FL
$V_{Sub}$ = FL $V_{CG}$ = Control Gate Voltage
$V_S$ = Source Voltage
$V_D$ = Drain Voltage
$V_{Sub}$ = P-Well Voltage.

10. A Flash EEPROM memory device including:

a semiconductor substrate comprising doped silicon with the substrate having a surface, a gate electrode stack comprising a tunnel oxide layer, a floating gate electrode, a dielectric layer, and a control gate formed over the surface of the semiconductor substrate, a source region and a drain region formed in the substrate self-aligned with the gate electrode stack with the source region and the drain region overlapping the gate electrode stack, and an asymmetric arrangement with a surface halo region formed only in the surface of the source region surrounded by the source region and juxtaposed with the gate electrode stack and with a slight overlap of the halo region with the gate electrode stack, whereby the channel erase function can be performed with a similar bias condition to the source erase function.

11. The device of claim 10 wherein a contact region is formed in the substrate adjacent to the drain region.

12. The device of claim 10 wherein the P+ $BF_2$ dopant was ion implanted into the halo region with a dose from about 5 E 14 ions/cm$^2$ to about 5 E 15 ions/cm$^2$ at an energy from about 10 keV to about 30 keV.

13. The device of claim 12 wherein a contact region is formed in the doped silicon semiconductor substrate.

14. The device of claim 13 wherein:

the tunnel oxide layer has a thickness from about 70 Å to about 120 Å, and the contact region is doped with boron P type dopant with a dose from about 5 E 14 ions/cm$^2$ to about 5 E 15 ions/cm$^2$.

15. The device of claim 10 wherein the device is erased with a negative voltage on the control gate electrode and a positive voltage on the source region.

16. The device of claim 10 wherein the device is erased with a negative voltage from about −10 Volts to about −15 Volts on the control gate electrode and a positive voltage from about 10 Volts to about 5 Volts on the source region.

17. A device in accordance with claim 10 wherein the device is erased with voltages applied during the erase mode as follows:

$V_{CG}$ = −10 V to −15 V
$V_S$ = 10 V to 5 V
$V_D$ = FL
$V_{Sub}$ = FL $V_{CG}$ = Control Gate Voltage
$V_S$ = Source Voltage
$V_D$ = Drain Voltage
$V_{Sub}$ = P-Well Voltage.

18. A device in accordance with claim 10 wherein the device is erased with voltages applied during the erase mode as follows:

$V_{CG}$ = −10 V
$V_S$ = 5 V
$V_D$ = FL
$V_{Sub}$ = FL $V_{CG}$ = Control Gate Voltage
$V_S$ = Source Voltage
$V_D$ = Drain Voltage
$V_{Sub}$ = Substrate Voltage.

19. A Flash EEPROM memory device including:

a semiconductor substrate comprising doped silicon, field oxide regions on the surface of the substrate, a gate electrode stack comprising a tunnel oxide layer, a floating gate electrode, a dielectric layer, and a control gate formed over the formed over the surface of the semiconductor substrate, a source region and a drain region formed in the substrate self-aligned with the gate electrode stack with the source region and the drain region overlapping the gate electrode stack, and an asymmetric arrangement with a surface halo region formed only in the surface of the source region surrounded by the source region and juxtaposed with the gate electrode stack and with a slight overlap of the halo region with the gate electrode stack, whereby the channel erase function can be performed with a similar bias condition to the source erase function.

20. The device of claim 19 wherein a contact region is formed in the semiconductor substrate adjacent to the drain region.

21. The device of claim 19 wherein the P+ $BF_2$ dopant was ion implanted into the halo region with a dose from about 5 E 14 ions/$cm^2$ to about 5 E 15 ions/$cm^2$ at an energy from about 10 keV to about 30 keV.

22. The device of claim 19 wherein a contact region is formed in the semiconductor substrate.

23. The device of claim 22 wherein:

the tunnel oxide layer has a thickness from about 70 Å to about 120 Å, and the contact region is doped with boron P type dopant with a dose from about 5 E 14 ions/$cm^2$ to about 5 E 15 ions/$cm^2$.

24. The device of claim 23 wherein the device is erased with a negative voltage on the control gate electrode and a positive voltage on the source region.

25. The device of claim 19 wherein the device is erased with a negative voltage from about −10 Volts to about −15 Volts on the control gate electrode and a positive voltage from about 10 Volts to about 5 Volts on the source region.

26. A device in accordance with claim 19 wherein the device is erased with voltages applied during the erase mode as follows:

| |
|---|
| $V_{CG}$ = −10 V to −15 V |
| $V_S$ = 10 V to 5 V |
| $V_D$ = FL |
| $V_{Sub}$ = FL |
| $V_{CG}$ = Control Gate Voltage |
| $V_S$ = Source Voltage |
| $V_D$ = Drain Voltage |
| $V_{Sub}$ = P-Well Voltage. |

27. The device of claim 19 wherein the device is erased with voltages applied during the erase mode as follows:

| |
|---|
| $V_{CG}$ = −10 V |
| $V_S$ = 5 V |
| $V_D$ = FL |
| $V_{Sub}$ = FL |
| $V_{CG}$ = Control Gate Voltage |
| $V_S$ = Source Voltage |
| $V_D$ = Drain Voltage |
| $V_{Sub}$ = P-Well Voltage. |

* * * * *